United States Patent
Lovell et al.

(10) Patent No.: US 11,782,396 B2
(45) Date of Patent: Oct. 10, 2023

(54) TOOLPATH GENERATION BY REINFORCEMENT LEARNING FOR COMPUTER AIDED MANUFACTURING

(71) Applicant: Autodesk, Inc., San Francisco, CA (US)

(72) Inventors: David Patrick Lovell, Moseley (GB); Akmal Ariff Bin Abu Bakar, London (GB); Saaras Mehan, West Bridgford (GB)

(73) Assignee: Autodesk, Inc., San Francisco, CA (US)

( * ) Notice: Subject to any disclaimer, the term of this patent is extended or adjusted under 35 U.S.C. 154(b) by 170 days.

(21) Appl. No.: 17/153,266

(22) Filed: Jan. 20, 2021

(65) Prior Publication Data

US 2021/0397142 A1    Dec. 23, 2021

Related U.S. Application Data

(60) Provisional application No. 63/042,264, filed on Jun. 22, 2020.

(51) Int. Cl.
| | | |
|---|---|---|
| *G05B 13/02* | (2006.01) | |
| *G06F 30/27* | (2020.01) | |
| *G06N 3/045* | (2023.01) | |
| *G05B 19/4097* | (2006.01) | |
| *G06F 30/10* | (2020.01) | |

(Continued)

(52) U.S. Cl.
CPC ....... *G05B 13/027* (2013.01); *G05B 19/4097* (2013.01); *G06F 30/10* (2020.01);
(Continued)

(58) Field of Classification Search
CPC .............. G05B 13/027; G05B 19/4097; G05B 2219/35134; G05B 2219/35167; G06F 30/10; G06F 30/27; G06N 3/0454
See application file for complete search history.

(56) References Cited

U.S. PATENT DOCUMENTS

| 7,117,056 B2 | 10/2006 | Balic |
|---|---|---|
| 2003/0187624 A1 | 10/2003 | Balic |

(Continued)

FOREIGN PATENT DOCUMENTS

| WO | WO2019112655 | 6/2019 |
|---|---|---|
| WO | WO2020032947 | 2/2020 |
| WO | WO2021092490 | 5/2021 |

OTHER PUBLICATIONS

Frederic Vignat, Systems and Methods for Virtual Environment for Reinforcement Learning in Manufacturing, 2019, U.S. Appl. No. 62,931,709, all.*

(Continued)

*Primary Examiner* — Thomas C Lee
*Assistant Examiner* — Ameir Myers
(74) *Attorney, Agent, or Firm* — Fish & Richardson P.C.

(57) ABSTRACT

Methods, systems, and apparatus, including medium-encoded computer program products, for computer aided design and manufacture of physical structures using toolpaths generated by reinforcement learning for use with subtractive manufacturing systems and techniques, include: obtaining, in a computer aided design or manufacturing program, a three dimensional model of a manufacturable object; generating toolpaths that are usable by a computer-controlled manufacturing system to manufacture at least a portion of the manufacturable object by providing at least a portion of the three dimensional model to a machine learning algorithm that employs reinforcement learning, wherein the machine learning algorithm includes one or more scoring functions that include rewards that correlate with desired toolpath characteristics comprising toolpath smoothness, toolpath length, and avoiding collision with the three dimensional model; and providing the toolpaths to the computer- (Continued)

controlled manufacturing system to manufacture at least the portion of the manufacturable object.

26 Claims, 6 Drawing Sheets

(52) U.S. Cl.
CPC .............. *G06F 30/27* (2020.01); *G06N 3/045* (2023.01); *G05B 2219/35134* (2013.01); *G05B 2219/35167* (2013.01)

(56) References Cited

U.S. PATENT DOCUMENTS

| | | | |
|---|---|---|---|
| 2019/0391562 A1* | 12/2019 | Srivastava | B23Q 15/04 |
| 2020/0096970 A1 | 3/2020 | Mehr et al. | |
| 2021/0003992 A1* | 1/2021 | Nakamoto | G05B 19/40931 |
| 2021/0132580 A1* | 5/2021 | Vignat | G06N 3/006 |
| 2021/0278822 A1* | 9/2021 | Campanelli | G05B 19/4183 |
| 2021/0291460 A1* | 9/2021 | Clark | B29C 64/393 |

OTHER PUBLICATIONS

Babaeizadeh, Mohammad, "Reinforcement Learning Through Asynchronous Advantage Actor-Critic on a SPU," arXiv:611.06256v3, Mar. 2, 2017, 12 pages.

Medium.freecodecamp.org [online], "An Intro to Advantage Actor Critic Methods: Let's Play Sonic the Hedgehog," published on Jul. 26, 2018, retrieved on Jan. 12, 2021, retrieved from URL<https://medium.freecodecamp.org/an-intro-to-advantage-actor-critic-methods-lets-play-sonic-the-hedgehog/>, 17 pages.

Mnih et al., "Playing Atari with Deep Reinforcement Learning," arXiv:1312.5602v1, Dec. 19, 2013, 9 pages.

Minh et al., Asynchronous Methods for Deep Reinforcement Learning, arXiv:1602.01783v2, Jun. 16, 2016, 19 pages.

Theregister.co.uk [online], "Sorry to Burst your Bubble, but Microsoft's 'Ms Pac-Man Beating AI' Is More Automatic Idiot," published on Jun. 15, 2017, retrieved on Jan. 12, 2021, retrieved from URL<https://www.theregister.co.uk/2017/06/15/microsoft_pac_man/>, 9 pages.

Towardsdatascience.com [online], "How to Teach AI to Play Games: Deep Reinforcement Learning," published on Nov. 15, 2018, retrieved on Jan. 12, 2021, retrieved from URL<https://towardsdatascience.com/how-to-teach-an-ai-to-play-games-deep-reinforcement-learning/>, 7 pages.

Bingran et al., "Trajectory smoothing method using reinforcement learning for computer numerical control machine tools", Robotics and Computer Integrated Manufacturing, Aug. 13, 2019, 61:101847.

Mozaffar et al., "Toolpath design for additive manufacturing using deep reinforcement learning", arXiv:2009.14365v1, Sep. 30, 2020, 8 pages.

PCT International Search Report and Written Opinion in International Appln. No. PCT/US2021/035631, dated Sep. 21, 2021, 17 pages.

* cited by examiner

TOOLPATH GENERATION BY REINFORCEMENT LEARNING FOR COMPUTER AIDED MANUFACTURING

CROSS-REFERENCE TO RELATED APPLICATIONS

This patent application claims priority to and the benefit of U.S. Provisional Patent Application No. 63/042,264, filed on Jun. 22, 2020, which is incorporated herein by reference in its entirety.

BACKGROUND

This specification relates to computer aided design and manufacture of physical structures, such as using subtractive manufacturing systems and techniques.

Computer Aided Design (CAD) software and Computer Aided Manufacturing (CAM) software has been developed and used to generate three-dimensional (3D) representations of objects and to manufacture the physical structures of those objects, e.g., using Computer Numerical Control (CNC) manufacturing techniques. Subtractive manufacturing refers to any manufacturing process where 3D objects are created from stock material (generally a "blank" or "workpiece" that is larger than the 3D object) by cutting away portions of the stock material. Subtractive manufacturing processes often involve the use of multiple CNC machine cutting tools in a series of operations that follow toolpaths that are previously determined (at least in part) manually.

Selecting toolpaths in CAM software can be difficult for novice users. CNC mills may have several axes and capabilities, and the geometry being machined may have a complex form that requires particular routing paths. Existing methods of selecting toolpaths involve the user knowing which of the categories of toolpaths are most appropriate, selecting that category, and manipulating many (often dozens) of parameters to achieve the desired result. However, even when users are given cues as to what types of toolpaths to use, it is not always evident which category of toolpath to select, and so users can often spend hours exploring the various categories and parameters trying to find their desired toolpath. In addition, POWERMILL® software (available from Autodesk, Inc. of San Rafael, Calif.) includes templates that are usable to generate toolpaths.

SUMMARY

This specification describes technologies relating to computer aided design and manufacture of physical structures using toolpaths generated by reinforcement learning for use with subtractive manufacturing systems and techniques.

In general, one or more aspects of the subject matter described in this specification can be embodied in one or more methods (and also one or more non-transitory computer-readable mediums tangibly encoding a computer program operable to cause data processing apparatus to perform operations) including: obtaining, in a computer aided design or manufacturing program, a three dimensional model of a manufacturable object; generating, by computer aided design or manufacturing program, toolpaths that are usable by a computer-controlled manufacturing system to manufacture at least a portion of the manufacturable object by providing at least a portion of the three dimensional model to a machine learning algorithm that employs reinforcement learning during training, wherein the machine learning algorithm includes one or more scoring functions that include rewards that correlate with desired toolpath characteristics including toolpath smoothness, toolpath length, and avoiding collision with the three dimensional model; and providing the toolpaths to the computer-controlled manufacturing system to manufacture at least the portion of the manufacturable object.

The desired toolpath characteristics can include tool engagement for a selected cutting tool and a contact track of a selected tool. The machine learning algorithm can employ variable feeds and/or speeds. The machine learning algorithm can include two or more machine learning algorithms, and providing at least the portion of the three dimensional model can include: processing at least the portion of the three dimensional model with a first of the two or more machine learning algorithms; and processing the portion of the three dimensional model with a second of the two or more machine learning algorithms. The first of the two or more machine learning algorithms can include a convolutional neural network used to generate data from the portion of the three dimensional model to be processed with the second of the two or more machine learning algorithms. The first of the two or more machine learning algorithms can operate on a low resolution view of at least the portion of the three dimensional model, and the second of the two or more machine learning algorithms can operate on a high resolution view of the portion of the three dimensional model.

The machine learning algorithm can include an advantage based actor-critic machine learning architecture. The toolpaths can be for 2.5-axis machining by the computer-controlled manufacturing system. Generating the toolpaths that are usable by the computer-controlled manufacturing system to manufacture at least the portion of the manufacturable object can include: generating a plurality of two dimensional (2D) representations of the three dimensional model at discrete 2D layers; providing each 2D representation to the machine learning algorithm to generate a corresponding set of toolpaths for manufacturing each discrete 2D layers; and generating the toolpaths that are usable by the computer-controlled manufacturing system by combining the corresponding sets of the toolpaths for the plurality of 2D representations of the three dimensional model at discrete 2D layers.

The machine learning algorithm can include two or more machine learning algorithms, and providing at least the portion of the three dimensional model to the machine learning algorithm can include: generating at least one starting position by processing a global view of at least the portion of the three dimensional model with a first of the two or more machine learning algorithms; and generating a set of toolpaths near each of the at least one starting position by processing a local view of at least the portion of the three dimensional model with a second of the two or more machine learning algorithms. Generating the at least one starting position can include processing the global view with the first of the two or more machine learning algorithms using discretized representations of the three dimensional model of the manufacturable object and of a model of a stock material from which the at least the portion of the manufacturable object is to be manufactured, and generating the set of toolpaths can include processing the local view with the second of the two or more machine learning algorithms using a continuous representation of a model of a tool in the computer-controlled manufacturing system to be used to manufacture the at least the portion of the manufacturable object. Generating the at least one starting position can include processing the global view with the first of the two or more machine learning algorithms using a discretized representation of the model of the tool, and generating the set of toolpaths can include processing the local view with the second of the two or more machine learning algorithms using continuous representations of the three dimensional model of the manufacturable object and of the model of the stock material.

The desired toolpath characteristics can include a turn direction of a tool being set based on a rotation direction of the tool. The turn direction of the tool can be set based on a location of the tool relative to the 3D model of the manufacturable object, and the one or more scoring functions can include one or more rewards that encourage freely choosing a turning direction for the tool when the location of the tool is greater than a threshold distance from the 3D model of the manufacturable object, and the one or more rewards can encourage the tool to turn only in one direction, which exposes a correct side of the tool based on the rotation direction, when the location of the tool is within the threshold distance from the 3D model of the manufacturable object. The machine learning algorithm can include one or more scoring functions that can include stage-based rewards that correlate with corresponding percentages of completion of the manufacturable object.

One or more aspects of the subject matter described in this specification can also be embodied in one or more systems including: a data processing apparatus including at least one hardware processor; and a non-transitory computer-readable medium encoding instructions configured to cause the data processing apparatus to perform operations including: obtaining, in a computer aided design or manufacturing program, a three dimensional model of a manufacturable object; generating, by computer aided design or manufacturing program, toolpaths that are usable by a computer-controlled manufacturing system to manufacture at least a portion of the manufacturable object by providing at least a portion of the three dimensional model to a machine learning algorithm that employs reinforcement learning during training, wherein the machine learning algorithm includes one or more scoring functions that include rewards that correlate with desired toolpath characteristics comprising toolpath smoothness, toolpath length, and avoiding collision with the three dimensional model; and providing the toolpaths to the computer-controlled manufacturing system to manufacture at least the portion of the manufacturable object.

Particular embodiments of the subject matter described in this specification can be implemented to realize one or more of the following advantages. Toolpaths that are usable to manufacture a three dimensional object can be automatically generated by a machine learning algorithm, which can reduce the time needed to make a manufacturing plan and reduce the time needed to manufacture parts. The machine learning algorithm uses reinforcement learning and can be trained to generate desired toolpaths characteristics using rewards for toolpath smoothness, toolpath length, and avoiding collision with the three dimensional model of the object. The machine learning algorithm can generate desired toolpath characteristics including tool engagement, smoothness of the contact track, tool axis variation, machining time, variable feeds, variable speeds, etc. The machine learning algorithm can generate toolpaths that are usable in 2.5-axis machining from two dimensional representations of the three dimensional model of the object. Moreover, by making the toolpaths generation process more automatic, a larger population of users can be enabled to design toolpaths. For example, there is no need for a user to explore and tweak the various parameters of a toolpath template (e.g., for a category of toolpath types) to find their desired toolpath.

The details of one or more embodiments of the subject matter described in this specification are set forth in the accompanying drawings and the description below. Other features, aspects, and advantages of the invention will become apparent from the description, the drawings, and the claims.

BRIEF DESCRIPTION OF THE DRAWINGS

Like reference numbers and designations in the various drawings indicate like elements.

DETAILED DESCRIPTION

Figure 1:
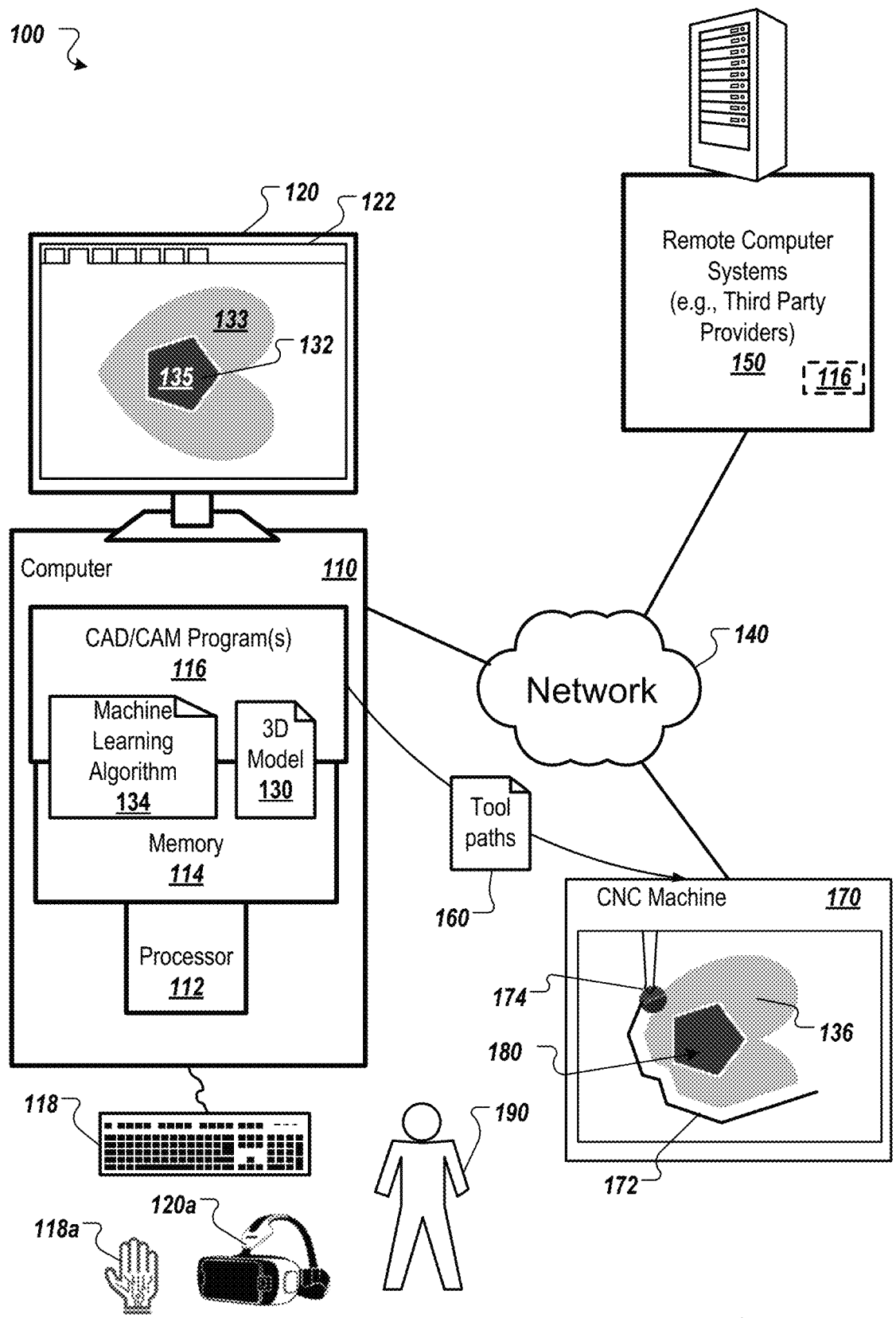
FIG. 1 shows an example of a system usable to design and manufacture physical structures.

FIG. 1 shows an example of a system 100 usable to design and manufacture physical structures. A computer 110 includes a processor 112 and a memory 114, and the computer 110 can be connected to a network 140, which can be a private network, a public network, a virtual private network, etc. The processor 112 can be one or more hardware processors, which can each include multiple processor cores. The memory 114 can include both volatile and non-volatile memory, such as Random Access Memory (RAM) and Flash RAM. The computer 110 can include various types of computer storage media and devices, which can include the memory 114, to store instructions of programs that run on the processor 112.

Such programs include one or more 3D modeling, simulation and manufacturing control programs such as Computer Aided Design (CAD) and/or Computer Aided Manufacturing (CAM) program(s) 116, also referred to as Computer Aided Engineering (CAE) programs, etc. The program(s) 116 can run locally on computer 110, remotely on a computer of one or more remote computer systems 150 (e.g., one or more third party providers' one or more server systems accessible by the computer 110 via the network 140) or both locally and remotely. A machine learning algorithm 134 can be stored in the memory 114 (and/or in the one or more remote computer systems 150) and can be accessed by the CAD/CAM program(s) 116.

The CAD/CAM program 116 presents a user interface (UI) 122 on a display device 120 of the computer 110, which can be operated using one or more input devices 118 of the computer 110 (e.g., keyboard and mouse). Note that while shown as separate devices in FIG. 1, the display device 120 and/or input devices 118 can also be integrated with each other and/or with the computer 110, such as in a tablet computer or in virtual reality (VR) or augmented reality (AR) system. For example, the input/output devices 118, 120 can include a VR input glove 118*a* and a VR headset 120*a*.

A user 190 can interact with the program(s) 116 to create and/or load a 3D model 132 (e.g., from a document 130) of an object 180 to be manufactured by a computer-controlled manufacturing system, e.g., by a CNC machine 170, such as a multi-axis, multi-tool milling machine, etc. This can be done using known graphical user interface tools, and the 3D model 132 can be defined in the computer using various known 3D modeling formats, such as using solid models (e.g., voxels) or surface models (e.g., B-Rep (Boundary Representation), surface meshes). In addition, the user 190 can interact with the program(s) 116 to modify the 3D model 132 of the object 180, as needed.

In some implementations, the 3D model 132 (e.g., from a document 130) can include a 3D model of the stock material (i.e., the "workpiece") that can be removed by the CNC machine 170 in a subtractive manufacturing process. In some implementations, a separate 3D model of the stock material can be obtained by the CAD/CAM program(s) 116. The stock material can be removed by the CNC machine 170 that follows a desired toolpath. For ease of illustration, the stock material is shown in a heart shape and the object to be manufactured is shown in a pentagon shape. This illustration does not correspond to the typical stock material workpieces and manufactured objects encountered in the field of subtractive manufacturing (e.g., milling).

Once the 3D model 132 of the object 180 is ready to manufacture, the 3D model 132 can be prepared for manufacturing the physical structure of the object 180 by generating toolpaths for use by the computer-controlled manufacturing system to manufacture the object 180. For example, the 3D model 132 can be used to generate a toolpath specification document 160, which can be sent to the CNC machine 170 and used to control operation of one or more milling tools. This can be done upon request by the user 190, or in light of the user's request for another action, such as sending the 3D model 132 to the CNC machine 170, or other manufacturing machinery, which can be directly connected to the computer 110, or connected via a network 140, as shown. This can involve a post-processing step carried out on the local computer 110 or a cloud service to export the 3D model 132 to an electronic document from which to manufacture. Note that an electronic document (which for brevity will simply be referred to as a document) can be a file, but does not necessarily correspond to a file. A document can be stored in a portion of a file that holds other documents, in a single file dedicated to the document in question, or in multiple coordinated files.

In any case, the program(s) 116 can create one or more toolpaths in the document 160 and provide the document 160 (of an appropriate format) to the CNC machine 170 to create the physical structure of the object 180 (note that in some implementations, the computer 110 is integrated into the CNC machine 170, and so the toolpath specification document 160 is created by the same computer that will use the toolpath specification document 160 to manufacture the object 180). The program(s) 116 can generate one or more toolpaths by providing the 3D model 132 (e.g., from the document 130) of an object 180 to the machine learning algorithm 134. The machine learning algorithm 134 can automatically generate toolpaths 172 (e.g., saved in the document 160) that are usable by the CNC machine 170 to manufacture the object 180. Rather than specifying types and parameters of a desired toolpath by a user 190 (e.g., through a menu in the UI 122), this automatic process can accelerate the toolpath generation process, which can reduce the time needed to make a manufacturing plan and likewise reduce the time needed to manufacture parts. For example, the CNC machine 170 can be a subtractive manufacturing machine that can manufacture the object 180 by removing stock material 136. The CNC machine 170 can use the toolpaths 172 (e.g., saved in the document 160) automatically generated by the machine learning algorithm 134 to control the cutting tool 174. For example, the cutting tool 174 can include a cutter that can be programmed to remove excess stock material when manufacturing an object using subtractive manufacturing.

The program(s) 116 can include in the UI 122 a series of menus that allow the user 190 to accept or reject one or more candidate toolpaths automatically generated by the machine learning algorithm 134. In some implementations, the program(s) 116 can include in the UI 122 a series of menus that allow the user 190 to adjust one or more portions of the candidate toolpaths until a user is satisfied with the toolpaths. Once the user accepts the candidate toolpaths, the program(s) 116 can save the candidate toolpaths in toolpath document 160 and can provide the document 160 to the CNC machine 170 to manufacture the physical structure of the object 180.

Figure 2A:
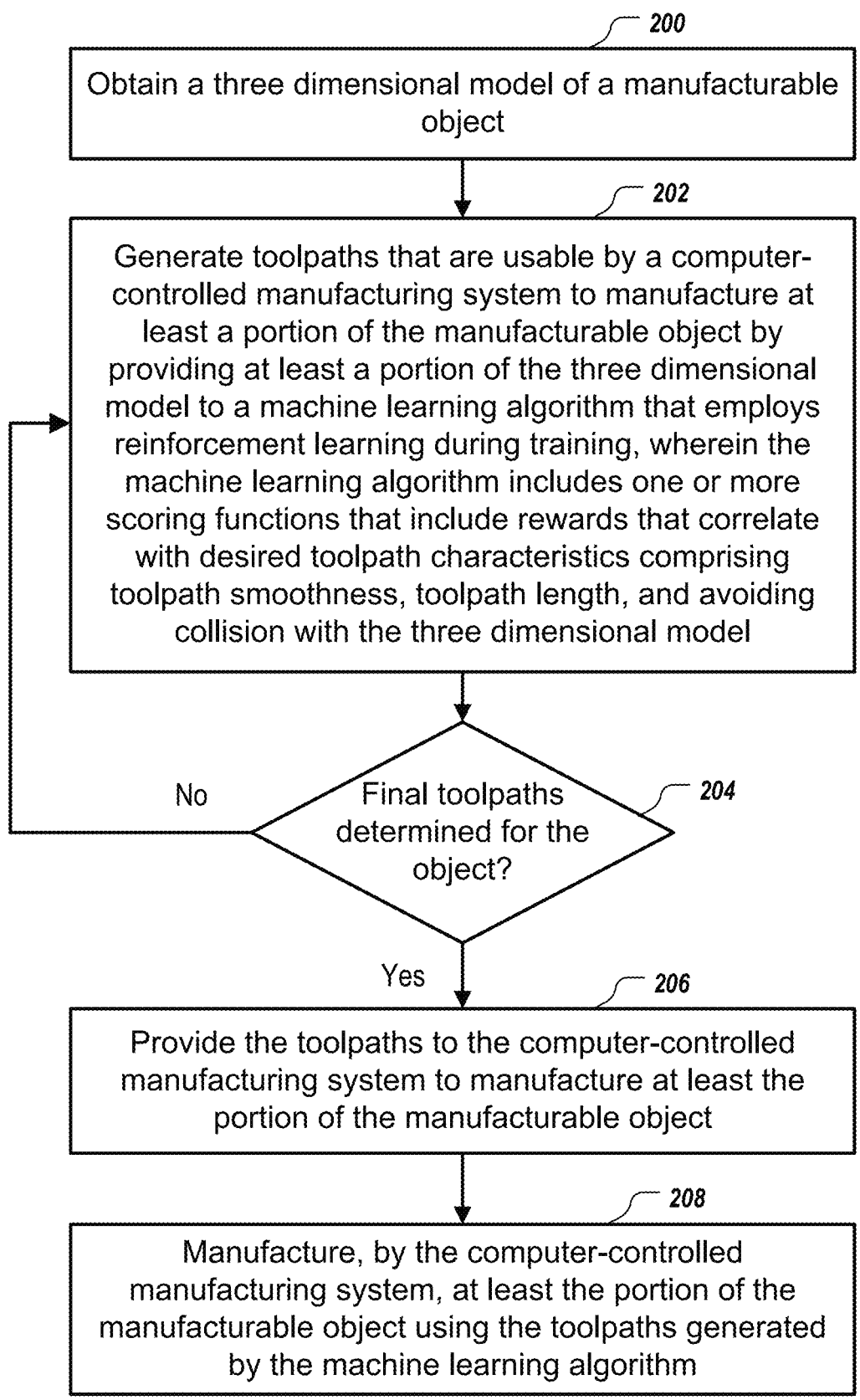
FIG. 2A is a flowchart showing an example of a process to generate toolpaths by a machine learning algorithm for use in manufacturing physical structures of modeled objects.

FIG. 2A shows an example of a process to generate toolpaths by a machine learning algorithm for use in manufacturing physical structures of modeled objects. A three dimensional model of a manufacturable object is obtained 200, e.g., by the program(s) 116. In other words, geometry of a modeled object to be manufactured by a CNC machine is identified. This can be done automatically by the computer (e.g., by program 116 on computer 110) or by receiving a user input. For example, the user can select a desired face, contour, or other geometry of a 3D model they are interested in machining. In some implementations, the program provides a user interface in which the user can directly select (e.g., click with a mouse) the geometry (e.g., face or contour) of interest.

In some implementations, after the three dimensional model of the object is obtained, one or more pre-processing processes can be performed on the three dimensional model, e.g., by the program(s) 116. For example, the program(s) 116 can remove portions of the 3D model that are too tight for the available tool(s) to fit into. As another example, the program(s) 116 can generate a set of 2D images that represent cross sections of the 3D model. Background regions, regions that are inside an object, and regions that are outside an object can be represented with different values in the input to a machine learning algorithm, e.g., by being represented with different colors in a 2D image.

The three dimensional model of the object can be in various representations. Possible representations can include image pixels, point clouds, voxels, meshes, contour maps, etc., or a combination of any two or more of the above representations. In some implementations, the representations can include a 2D image of a 2D view of the 3D object, or multiple 2D images of a local geometry of the 3D model from multiple angles. In some implementations, the models of the available tool(s), the models of the object and the models of the stock material can use same or different representations.

In some implementations, one or more of the models of the available tool(s), the models of the object, and the models of the stock material can use a continuous representation (defined by one or more smooth functions) instead of a discretized representation (e.g., using pixels). For example, instead of using a discrete pixel representation, a milling tool can be represented by a continuous circle defined by a center coordinate and a radius of the milling tool. The milling tool can be represented in a circular shape that is centered at the center coordinate of the tool and has a radius that is equal to the radius of the tool. Using this circular representation, the program(s) 116 can calculate whether a pixel of the stock material is within a range of the tool using the radius of the tool. As another example, the model of the object and/or the model of the stock material can have continuous representations (defined by one or more smooth functions, e.g., by continuous B-Reps) instead of discretized representations (e.g., using pixels).

One or more toolpaths are generated 202 by providing at least a portion of the three dimensional model to a machine learning algorithm, e.g., by the program(s) 116. The generated toolpaths are usable by a computer-controlled manufacturing system, e.g., the CNC machine 170, to manufacture at least a portion of the manufacturable object. In some implementations, the toolpaths generated by the machine learning algorithm can be usable to manufacture the entire object.

In some implementations, the machine learning model can generate a series of locations for the tool to pass through. In some implementations, the machine learning model can generate a series of velocity vectors (e.g., directions to accelerate the tool in) for the tool. For example, the locations and velocity vectors can be represented in a unit of pixels and the tool can move by a number of pixels in each step. The sequence of locations can include a series of coordinates of pixels in a 2D environment. In a 3D environment, the sequence of locations of the tool can include the coordinates of voxels in 3D and a 3D orientation of the tool. The CAD/CAM program(s) 116 can generate one or more splines in a post-processing step that connects all or a portion of the series of locations. The one or more splines can be saved as toolpaths and can be used to control the tool to travel through these points in smooth routes. In some implementations, the machine learning model can generate the control mechanism of the tool, e.g., the angle of the cutter. The CAD/CAM program(s) 116 can generate toolpaths with the control mechanism of the tool that is generated by the machine learning algorithm.

In general, a machine learning algorithm builds a mathematical model based on training data. The machine learning algorithm takes as input at least a portion of the three dimensional model of the object. The machine learning algorithm can also take a representation of the environment as input, e.g., a model of the stock materials that need to be removed during manufacturing. In some implementations, the model of the stock materials from which the object is to be cut can be a default model used by the program(s) or can be provided to the program(s) by the user or another process. In some implementations, the representation of the environment can use ray tracing, i.e., describing a current environment using distances from the stock along a set of rays that start from the tool.

Figure 2B:
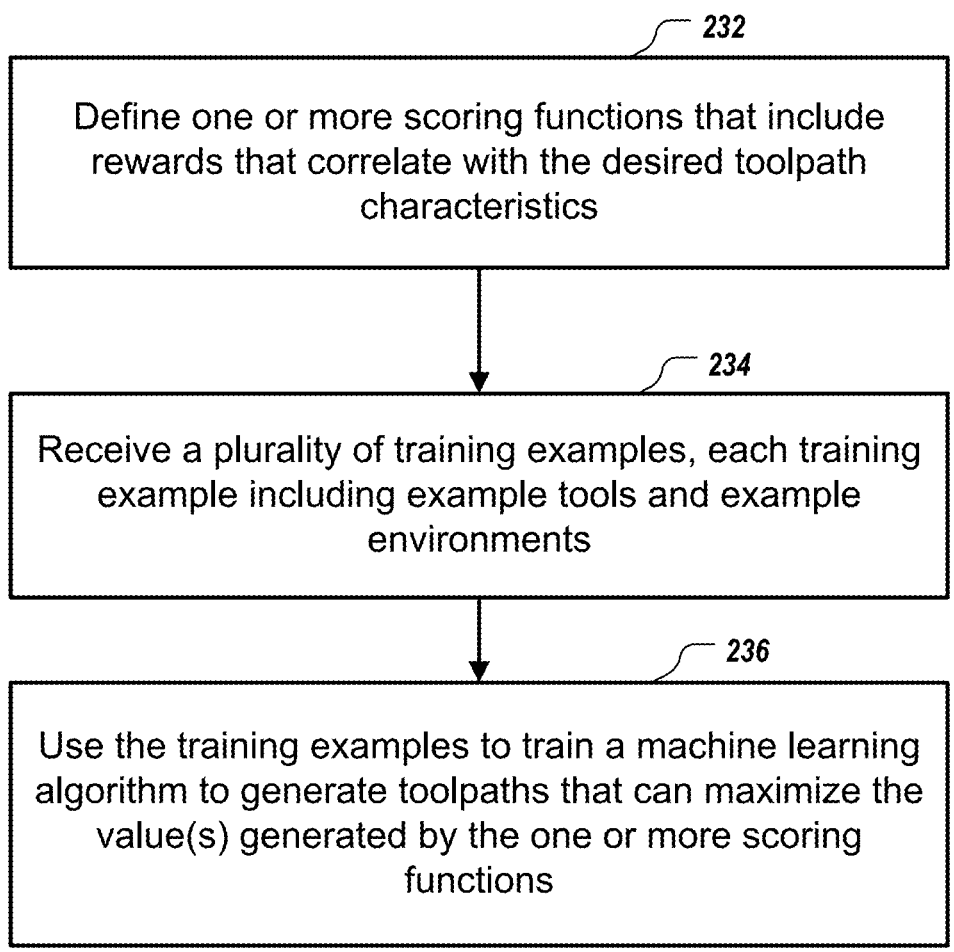
FIG. 2B is a flowchart showing an example of a process to train a machine learning algorithm that generates toolpaths by reinforcement learning.

The machine learning algorithm can be trained to generate toolpaths with a set of desired toolpath characteristics. FIG. 2B is a flowchart showing an example of a process to train a machine learning algorithm that generates toolpaths by reinforcement learning. One or more scoring functions that include rewards that correlate with the desired toolpath characteristics are defined 232. The machine learning algorithm can employ reinforcement learning to include one or more scoring functions that include rewards that correlate with the desired toolpath characteristics. The machine learning algorithm can include rewards for desired toolpath behaviors and can include penalties for other undesired toolpath behaviors. The main goal for the rewards is to discourage bad behaviors of the cutting tool while encouraging good cuts and discouraging bad cuts. Examples of the bad behaviors of the tool can include moving into the CAD model, and staying in one spot and changing direction indefinitely, etc.

The desired toolpath characteristics can include maximizing toolpath smoothness (e.g., the track of the center of the tool being smooth), minimizing toolpath length, minimizing machining time, etc. For example, a toolpath that suddenly does a 90 degree turn may not be desired. A toolpath that does zigzagging paths may not be desired as well. Penalties or negative rewards can be applied to these undesired toolpath characteristics.

The desired toolpath characteristics can also include avoiding collision with the three dimensional model. In some implementations, the machine learning model may include a hard limit that stops the tool from hitting the CAD model. In some implementations, the machine learning algorithm may include a penalty function that penalizes the machine learning model for attempting to move into the CAD model.

In some implementations, the desired toolpath characteristics can further include choosing and optimizing a side of the cutter in the toolpath for the computer aided manufacturing process. In a given step of the computer aided manufacturing process, a cutter can include a correct side (i.e., correct region) of the cutter, a wrong side (i.e., incorrect region) of the cutter, and a neutral side (i.e., neutral region) between the correct side of the cutter and the wrong side of the cutter. Using the correct side of the cutter in a given step, the toolpath can generate good cuts, e.g., pixels of the stock material removed by the correct side of the cutter. Using the wrong side of the cutter in a given step, the toolpath can generate bad cuts, e.g., pixels of the stock material removed by the wrong side of the cutter. Using the neutral region of the cutter, the toolpath can generate neutral cuts, e.g., pixels of the stock material removed by the neutral region between the correct and wrong side of the cutter.

Choosing and optimizing among the correct side, wrong side and neutral side of the cutter is an important constraint that encourages the machine learning algorithm to create desired toolpaths. A desired toolpath motion can remove stock material while also exposing the correct side of the cutter. The machine learning algorithm can be trained to generate proper toolpaths that can use the correct side of the tool based on the moving direction of the tool. For example, if the tool was in the same position but was travelling in a different direction, the correct side and the wrong side of the tool relative to the tool's traveling direction would be different. As another example, the desired toolpath characteristics can include removing as much stock material as possible and as fast as possible while only using the correct side of the cutter.

The correct side, the wrong side, and the neutral side of the cutter can each occupy a certain percentage of the cutter. For example, the correct side, the wrong side, and the neutral size of the cutter can respectively occupy 49%, 49% and 2% of the cutter. As another example, the correct side, the wrong side, and the neutral size of the cutter can respectively occupy 20%, 70% and 10% of the cutter. When the correct side of the cutter occupies a smaller percentage of the cutter, the tool can remove thinner amounts of the stock material, and the machine learning algorithm can be trained to generate smaller updates when selecting and changing the side of the cutter at each step.

In some implementations, the desired toolpath characteristics can further include optimizing tool engagement for a selected cutting tool, maximizing smoothness of a contact track of the selected cutting tool (e.g., a contact track of the tool being smooth), minimizing tool axis variation, maximizing smoothness of tool axis variation, avoiding leaving small lumps of stock material, limiting tool engagement angle, or any other suitable toolpath characteristic. For example, the machine learning algorithm can include a reward for using a good part of the cutter (e.g., the edge of the cutter) during climb milling or during other milling operations, in order to avoid using a bad part of the cutter (e.g., the middle part of a ball nose cutter, or a bottom part of a bull nose cutter), and/or in order to avoid using a wrong side of the cutter (e.g., in climb or conventional milling). As another example, the machine learning algorithm can limit the tool engagement angle by penalizing a score if too many pixels of an image representation of the model are engaged (e.g., touched by the tool) at the same time.

In some implementations, the machine learning algorithm can include rewards for the tool location and/or rotation characteristics, e.g., rotate on the spot, or moving forward. For example, the machine learning algorithm can include rewards that discourage the machine learning algorithm from continuously deciding to change direction in one way, causing the tool to rotate about a point in the environment, i.e., rotating on the spot. In some implementations, the rewards for tool location and/or rotation characteristics can be combined with the toolpath smoothness rewards to generate a smooth toolpath, e.g., generating a smooth cut around a part. At each step, the machine learning algorithm can include rewards for keeping or changing the rotation direction of a tool. The machine learning algorithm can include rewards for rotating the tool at the same location before moving the tool to a different location. In some implementations, at each step, the machine learning algorithm can include rewards that always move the tool to a different location, and prevents the tool from staying at the same location. In some implementations, the machine learning algorithm can include rewards that allow the tool to rotate on the spot, or move forwards, but not both at the same time, which may help increase the completion percentage and prevent the tool from hitting the CAD model. In some implementations, the machine learning algorithm can include rewards that make the tool only rotate counterclockwise (i.e., anticlockwise), or only rotate clockwise, or allowing the tool to rotate both clockwise and counterclockwise. For example, in some implementations, it can be more desirable to make the cutter rotate counterclockwise than clockwise, because when the cutter hits the CAD model, the default counterclockwise turn direction can expose the correct side of the cutter. As another example, in some implementations, it can be desirable to make the tool rotate both clockwise and counterclockwise, e.g., turning clockwise on one step then turning counterclockwise on the following step and repeating these two steps, which may help produce a smoother outer profile of the manufactured object. In some implementations, being able to rotate in both directions can make the tool easier to produce a smooth toolpath because the tool does not need to make several consecutive decisions to turn in the same direction in order to face a certain direction.

In some implementations, the desired toolpath characteristics can include setting the turn direction of a tool based on a location of the tool relative to the model of the manufacturable object. When the location of the tool is greater than a threshold distance from the model of the manufacturable object, the one or more scoring functions can include one or more rewards that encourage freely choosing a turning direction for the tool. For example, when the tool is farther away (e.g., more than 1 millimeter away) from the CAD model, the system can freely choose the turn direction in order to create smoother toolpaths. When the location of the tool is within the threshold distance from the model of the manufacturable object, the one or more scoring functions can include one or more rewards that encourage the tool to turn only in one direction, which can result in exposing a correct side of the tool based on the rotation direction. For example, when the tool is closer to (e.g., less than 1 millimeter to) the CAD model, the system can make the tool only turn counterclockwise to prevent the tool from getting stuck to the CAD model.

In some implementations, the machine learning algorithm can include rewards for removing the representation of the stock material. The machine learning algorithm can increase the amount of rewards for removing stock material close to the CAD model and/or increase the amount of rewards for removing stock material as more stock material has been removed. In some implementations, the machine learning algorithm can include stage-based rewards. The stage-based rewards can include larger awards for higher level (including up to 100%) of completion and can help ensure that the machine learning algorithm finishes the removal of all the stock material around the CAD model. For example, different levels of rewards can be set at 50%, 95% and 99% completions, or at 80%, 95%, 99% and 100% completions. Having a significantly high amount of reward at 100% completion can prevent the machine learning algorithm from only removing the stock material that is farther away from the CAD model (e.g., deciding that it has earned enough rewards) before actually finishing the machining of the CAD model. As another example, when there is only a small amount of stock material left, the rewards for removing the small amount of stock material can be increased. The machine learning algorithm trained with the stage-based rewards can generate toolpaths with higher percentage (including up to 100%) of completion of milling of the modeled object.

In some implementations, the machine learning algorithm can employ variable tool feeds (e.g., percentage of cutter used), variable tool speeds (e.g., feed rates), or variable cutting forces, etc. In some implementations, the machine learning algorithm can employ a trochoid motion. For example, if the tool needs to cut through a slot of stock material with CAD model on both sides, the tool can move in a trochoid motion to avoid excessive tool engagement. As another example, if the tool travels around the outside of the stock material, the tool can move in a spiral motion, instead of a trochoid motion. The use of variable feed rates can reduce the potential need to achieve an optimum engagement 100% of the time by allowing the tool to speed up or to slow down during an otherwise undesired machining operation (e.g., a heavy cut) that the machine learning algorithm may produce. Thus, the machine learning algorithm can achieve good engagement most of the time (e.g., 99% of the time) and can readily slow down the cutter during any undesired machining operation (e.g., a heavy cut) that may happen occasionally, as opposed to attempting to get the machine learning algorithm to achieve 100% tool engagement conforming behavior all the time.

An example of a reward function can be a function of the following factors:

Number of good cuts (e.g., a number of pixels of the stock material removed by a correct side of the cutter in a given step), Number of bad cuts (e.g., a number of pixels of the CAD model removed by a wrong side of the cutter in a given step), Number of neutral cuts (e.g., a number of pixels that contacted the CAD model removed by a neutral region between the correct side and the wrong side of the cutter in a given step), Were there any bad cuts?

Was the CAD model hit?

Is the tool in a position it has been to before?

Is the tool spinning on the spot, or tool velocity=0?

Was a completion threshold reached?

The reward function can include weighting coefficients for each of the factors. A positive weighting coefficient can be assigned to a desired toolpath characteristic, e.g., number of good pixel cuts. A negative weighting coefficient (e.g., indicating a penalty) can be given to an undesired toolpath characteristic, e.g., number of bad pixel cuts, or the fact that the CAD model was hit. The values for the weighting coefficients can be pre-determined, or can be learned when training the machine learning algorithm.

In some implementations, the machine learning algorithm can include long-term rewards, short-term rewards, or a combination of both. In some implementations, the machine learning algorithm can employ a reward function for each step in a plurality of steps of the generated toolpath. The total reward can be a sum of all the rewards corresponding to the plurality of steps. In some implementations, one or more discount rates for the rewards can be applied over time. The discount rates can determine how much the reinforcement learning algorithm evaluates the rewards in the distant future relative to the rewards in the immediate future. The discount rate can be a value between 0 and 1. For example, a discount rate can be set to 0.99.

The input to the machine learning algorithm can be an observation of its environment. In some implementations, at each step, the machine learning algorithm can determine a location of the tool based on a local view of the model, without information of the entire model. For example, the machine learning algorithm can efficiently determine how the tool should interact with the stock material using a high resolution image near the current location of the tool, e.g., image data for only stock material and CAD model that is within a defined distance from the edge of the tool, the defined distance been one quarter or half of the tool's diameter or just the tool's diameter. In some implementations, the machine learning algorithm can take as input one or more views of the environment and can make decisions based on the one or more views of the environment. For example, for a 3D environment, two or more 2D views of the environment can be provided as input to the machine learning algorithm. In some implementations, the machine learning algorithm can take as input one or more views of the environment at the current step and one or more views of the environment at one or more previous steps. For example, an observation of the environment can include three images: a current 2D view of the environment and two 2D views of the environment from two previous steps.

The output of the machine learning algorithm can be toolpaths that include a sequence of tool locations in a plurality of steps. Each tool location can represent where the CAM system should move a representation of a cutting tool. For example, each tool location can be an (x, y, z) coordinate of the tool head. The sequence of the tool locations can be next to each other (e.g., a turn or moving forward by one pixel in a 2D image representation), or further apart (e.g., moving a long distance in a single step).

The machine learning algorithm can employ a variety of reinforcement learning algorithms. Examples of reinforcement learning algorithms include Q-learning, State-Action-Reward-State-Action (SARSA), Deep Q-Learning Network (DQN), Asynchronous Advantage Actor-Critic (A3C) network, Deep Deterministic Policy Gradient (DDPG), hybrid reward architecture (HRA), etc. The reinforcement learning algorithm can employ online learning or offline learning, on-policy learning or off-policy learning, hierarchical reinforcement learning, etc. In some implementations, the reinforcement learning algorithm can include a recurrent neural network architecture that uses a previous output state as an input to the next step, e.g., a gated recurrent unit (GRU), or a Long Short-Term Memory (LSTM) neural network. The neural network architecture can include a convolutional neural network (CNN) including one or more convolutional layers with configurable sizes, one or more fully connected layers, one or more activation layers, or skip connections between the layers, etc.

Figure 2C:
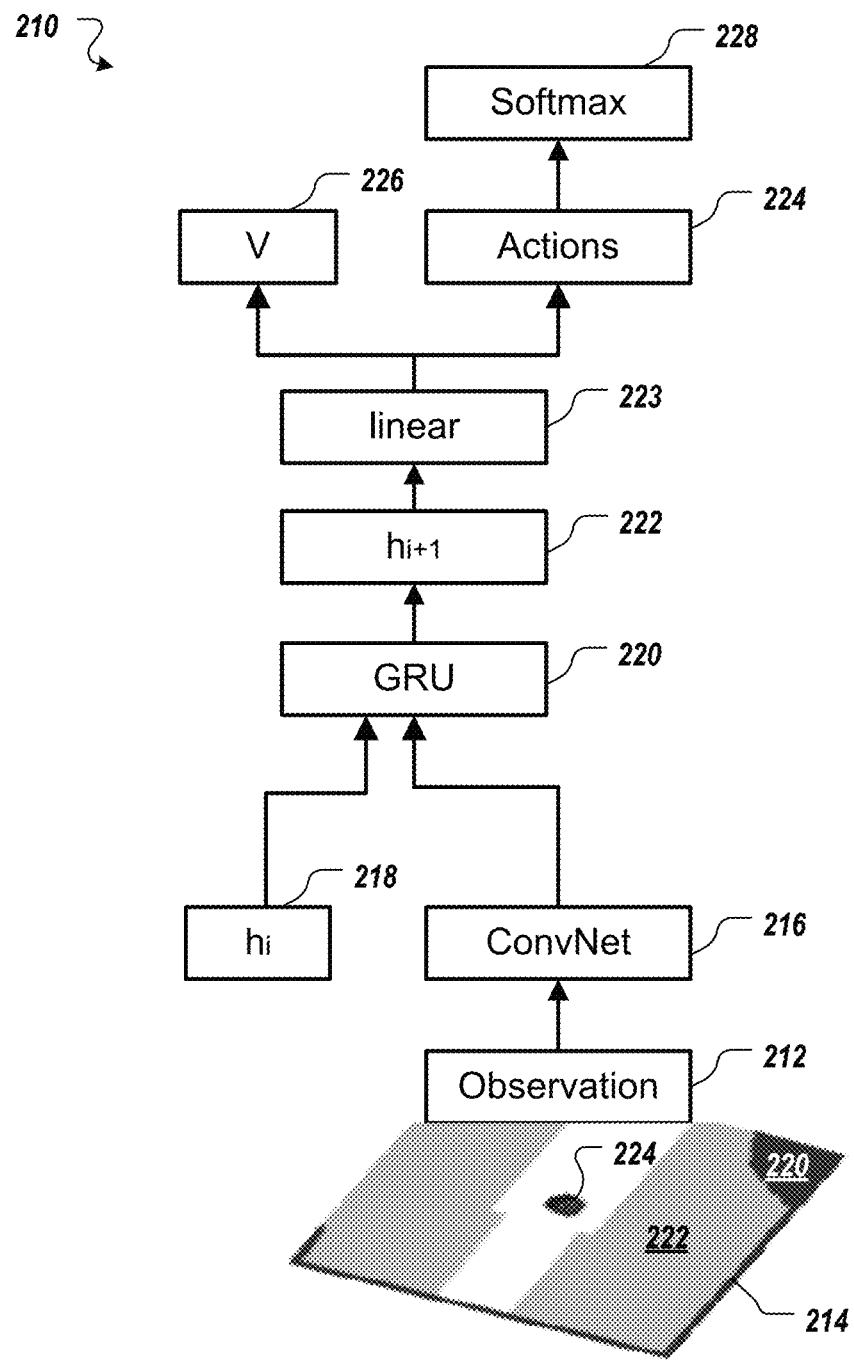
FIG. 2C is a schematic diagram showing an example of a neural network architecture for a machine learning algorithm that generates toolpaths for use in manufacturing physical structures of modeled objects.

FIG. 2C is a schematic diagram showing an example of a neural network architecture 210 for a machine learning algorithm that generates toolpaths for use in manufacturing physical structures of modeled objects. This implementation employs an unsupervised machine learning algorithm that does not require expert-crafted sample solutions in the training examples. This neural network architecture uses a reinforcement learning algorithm, specifically, an Advantage Actor-Critic architecture. The input to the machine learning algorithm can be an observation 212 of the environment that describes a model of the object 220, a model of the stock material 222 and model(s) of the available tool(s) 224. For example, the input to the machine learning algorithm can be a 2D image 214 corresponding to a square region around the tool 224 as the tool moves through the environment.

The neural network architecture 210 can include a convolutional neural network (i.e., ConvNet 216) that can generate one or more feature vectors from the observation 212. For example, the ConvNet 216 can include a convolution layer with size 4, stride 2 that can generate a feature vector with 32 channels. A recurrent neural network, e.g., GRU 220, can take as input a state vector $h_i$ 218 generated at a previous time step by the GRU 220 and one or more feature vectors generated from the ConvNet 216. The recurrent neural network, e.g., the GRU 220, can generate a state vector $h_{i+1}$ 222 of the current time step. For example, the state vector $h_{i+1}$ 222 can have a predetermined length of 256. The state vector $h_{i+1}$ 222 of the current time step can be processed through one or more linear operations 223. The output of the neural network architecture can include a plurality of actions 224 and one or more values 226. The actions 224 can describe the toolpaths for manufacturing the modeled object, e.g., a velocity vector to move the tool, or the direction to accelerate the tool in. The one or more values 226 can represent the value score of being in a particular state that corresponds to the state vector $h_{i+1}$ 222. For example, a state where the tool is very close to the CAD model may have a low value score because there is a probability that the tool can hit the CAD model and thus can result in a large negative reward. In some implementations, a Softmax function 228 can be applied to the actions 224 and the output of the Softmax function 228 can include a probability distribution of the possible actions.

The machine learning algorithm can determine the sequence of tool locations in a plurality of steps based on what it has learned from past experiences gained during a training process. The machine learning algorithm can be trained with training examples that includes example tools and example environments. Referring again to FIG. 2B, a plurality of training examples can be received 234, and each training example can include example tools and example environments. During training, the parameters (e.g., a set of weights) of the machine learning algorithm can be iteratively updated based on the training examples, until a stopping criterion is satisfied. The training examples can include samples from a real CAM process or from a simulated CAM process, or a combination of both. For example, a training example can include real or simulated cutting forces information for one or more milling tools, and such cutting forces information can also be added to the scoring mechanism during training. The training examples can include 2D environments or 3D environments. The training examples can include representations of 2D tools or 3D tools. In some implementations, one or more pre-processing operations can be performed on the training examples. For example, if a portion of the example environment is too tight for the available tool(s) to fit into, the portion of the example environment can be removed such that the training example includes a CAD model that can achieve 100% completion. Therefore, the machine learning algorithm can be trained to remove all of the stock material in the training example.

The training examples can be used 236 to train the machine learning algorithm to generate toolpaths that can maximize the value(s) generated by the one or more scoring functions. In some implementations, the machine learning algorithm can employ an unsupervised training of the reinforcement learning algorithm. During the unsupervised training, the machine learning algorithm does not receive desired outputs or expert-labeled sample solutions. The reinforcement learning algorithm can determine an output by maximizing one or more scoring functions that include rewards that correlate with the desired toolpath characteristics. For example, the reinforcement learning algorithm can be trained to maximize rewards received from an observed machining environment. By engineering the rewards to correlate with the desired toolpath characteristics, the reinforcement learning algorithm can be trained to produce desired toolpaths.

In some implementations, the machine learning algorithm can employ an appropriate training method for a corresponding reinforcement learning algorithm that has been chosen. For example, a reinforcement learning algorithm based on an actor-critic network can be trained using an asynchronous training method. In the asynchronous training method, at each iteration, duplicates of the reinforcement learning network with a current set of weights can be created. Each duplicate of the network can run its own simulation by interacting with a part of the environment. Current performances from the duplicates can be collected from their simulations accumulated over a number of steps. An update to the set of weights can be calculated based on the collected performances through optimization algorithms, e.g., stochastic gradient descent (SGD) with or without momentum, root mean square propagation (RMSProp) with or without shared statistics, etc. The set of weights can be iteratively updated based on the performances of the reinforcement learning model until a stopping criterion is satisfied, e.g., a fixed number of iterations has been completed, the changes to the weights are smaller than a threshold, or a limit of a precision has been reached.

In some implementations, instead of on-policy training, an off-policy training can be used when training the machine learning algorithm. The off-policy training can use sample toolpaths generated from a different source other than a machine learning algorithm to evaluate and train the machine learning algorithm. The sample toolpaths generated from a difference source can include real life toolpath data that is already being used in computer aided manufacturing, or toolpath data that is designed by a human with or without a template, etc. For example, the reinforcement learning algorithm can evaluate its performance and can learn parameters of the algorithm from expert crafted toolpaths. In some implementations, experience replay optimization can be used when training the reinforcement learning algorithm. Experience replay may help increase the sample efficiency by allowing samples to be reused, and potentially allowing training samples with interesting and challenging scenarios to be used more often.

After training is finished, the machine learning algorithm can generate toolpaths that can be used to manufacture an object that is not among the training examples, or objects that the machine learning algorithm has not been trained with. Additional training examples that can represent one or more new objects (e.g., one or more new parts) can be obtained. The machine learning algorithm can be further trained with a combination of the existing training examples and the additional training examples. In some implementations, for the purpose of rapid training, the machine learning algorithm can be trained by performing fine-tuning based on a previously trained machine learning model, i.e., parameters of the machine learning model are updated from previously learned parameters, instead of calculated from scratch (e.g., random numbers or zeros). The toolpaths generated by the machine learning algorithm for these new parts can be further improved after the machine learning algorithm is trained with the addition of new training examples. In some implementations, the additional training examples can include data corresponding to user modifications to the toolpaths that a machine learning algorithm has previously generated. The data corresponding to user modifications can be used to train an improved machine learning algorithm that can generate more desirable toolpaths.

In some implementations, the machine learning algorithm can include two or more machine learning algorithms. At least a portion of the three dimensional model can be processed with a first of the two or more machine learning algorithms. The portion of the three dimensional model can be further processed with a second of the two or more machine learning algorithms.

In some implementations, the first of the two or more machine learning algorithms can include a convolutional neural network (CNN) used to generate data (e.g., image features) from a portion of the three dimensional model. Examples of CNNs can include AlexNet, InceptionNet, ResNet, DenseNet, etc., or other types of CNNs that can perform image recognition tasks. In some implementations, the machine learning algorithm can take as input a 2D image that represents a 2D cross section representation of the 3D model of the object and the stock material in the environment. Convolutional neural networks can effectively extract useful image features from the 2D image through two or more convolutional layers that perform a series of linear and non-linear operations. The extracted image features can represent the relationships between the remaining stock material, the model of the object and the location of the tool. The generated data, e.g., the extracted image features, can be processed with the second of the two or more machine learning algorithms. For example, the second machine learning algorithm can be a reinforcement learning network (e.g., Asynchronous Advantage Actor-Critic (A3C) network) that can generate toolpaths usable in computer-controlled manufacturing.

In some implementations, the first of the two or more machine learning algorithms can operate on a low resolution view of at least a portion of the three dimensional model. The second of the two or more machine learning algorithms can operate on a high resolution view of the portion of the three dimensional model. For example, the first algorithm can generate a plurality of starting locations to position the tool using a low resolution view of the model of the object. Based on a high resolution view around each starting location, the second algorithm can generate a toolpath that starts from each starting location generated by the first algorithm, and the toolpath can be used to manufacture a local portion of the object. Details of the two or more machine learning algorithms are described below in connection with FIG. 3.

Referring again to FIG. 2A, the toolpaths generated by the machine learning algorithm are provided to a user to determine 204 whether the toolpaths are acceptable final toolpaths for the object, e.g., by the program(s) 116. The program(s) 116 can include in the UI 122 a UI element that allows the user 190 to accept or reject one or more candidate toolpaths automatically generated by the machine learning algorithm. For example, the user can watch a video that simulates a process of manufacturing the object using the one or more candidate toolpaths.

If a user determines that the generated toolpaths are not acceptable to manufacture at least a portion of the manufacturable object, the program(s) 116 can generate updated toolpaths using the machine learning algorithms. In some implementations, the program(s) 116 can include in the UI 122 UI element(s) that allow the user 190 to specify updated desired toolpath characteristics. The machine learning algorithm can generate updated toolpaths using one or more scoring functions that include rewards that correlate with the updated toolpath characteristics. In some implementations, the program(s) 116 can include in the UI 122 UI element(s) that allow the user 190 to manually edit one or more portions of the candidate toolpaths until a user is satisfied with the toolpaths. Further, in the event that the machine learning algorithm generates toolpath(s) that cannot remove one or more pieces of the stock material, the user 190 can employ the UI 122 UI element(s) to add to the automatically generated toolpath(s) in order to ensure that all stock material is removed during the subtractive manufacturing process, i.e., extending the generated toolpath(s) can be done in addition to modifying the generated toolpath(s).

Once a user determines 204 that the generated toolpaths are acceptable to manufacture at least a portion of the manufacturable object, the toolpaths are provided 206 to the computer-controlled manufacturing system to manufacture at least a portion of the manufacturable object, e.g., by the program(s) 116. In some implementations, the program(s) 116 can save the candidate toolpaths in toolpath document 160 in FIG. 1. The program(s) 116 can provide the document 160 to the CNC machine 170 to manufacture the physical structure of the object 180.

The computer-controlled manufacturing system manufactures 208 at least a portion of the manufacturable object using the toolpaths generated by the machine learning algorithm. The manufacturing of the modeled object can involve roughing operations, finishing operations, and optionally, semi-finishing operations between these two operations. The roughing operations can include cutting away most of the stock material, but leaving some stock material on the modeled object. The finishing operations can include cutting away all remaining stock material and generating the final manufactured object with a good finish. Each of the roughing, finishing and semi-finishing operations can have their own toolpaths. The machine learning algorithm can be used to generate toolpaths for the roughing operations, the finishing operations, or the semi-finishing operations.

Figure 3:
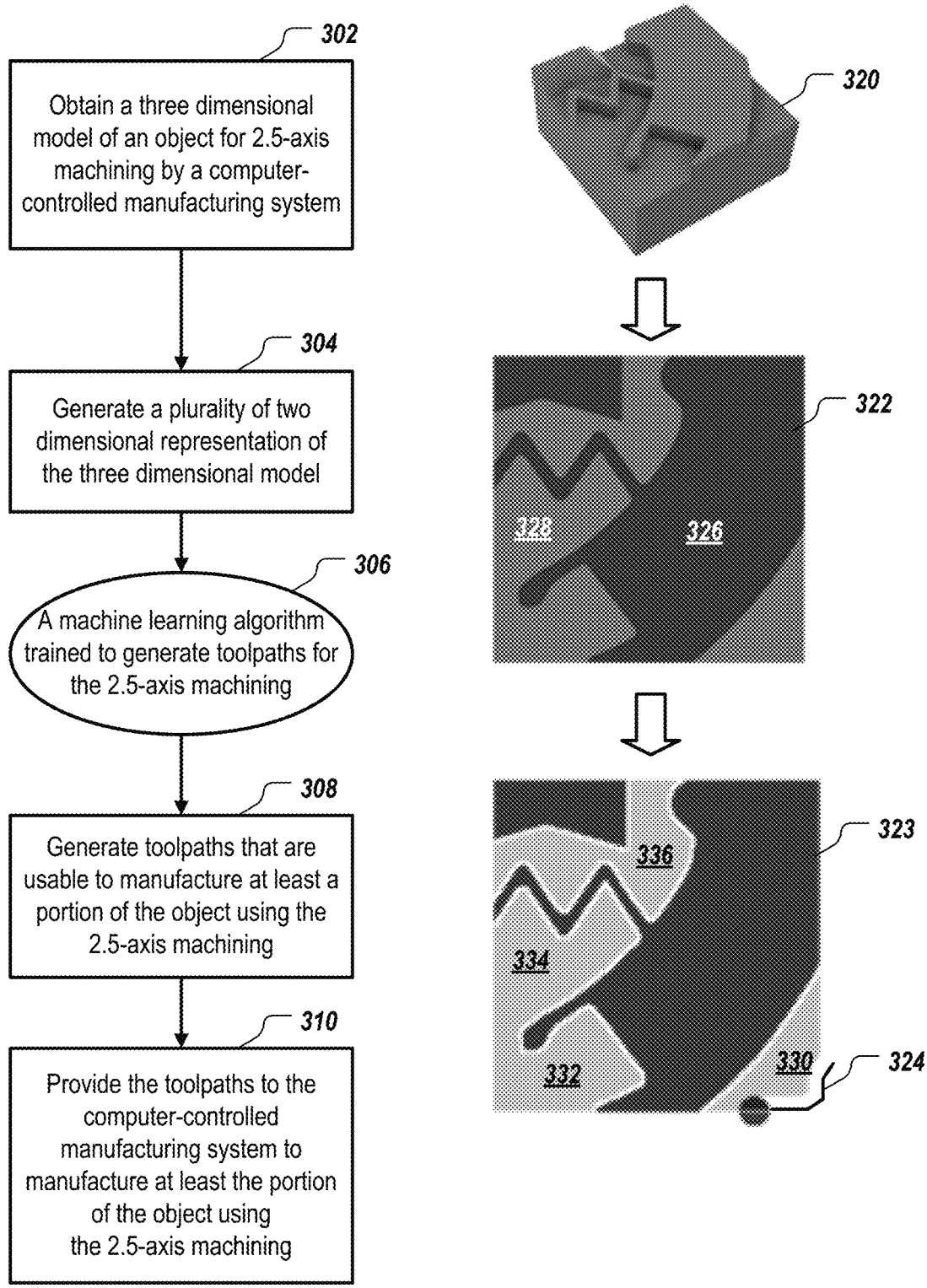
FIG. 3 shows an example of a process to generate toolpaths by a machine learning algorithm for 2.5-axis machining.

FIG. 3 shows an example of a process to generate toolpaths by a machine learning algorithm for 2.5-axis machining. The 2.5-axis machining is a type of subtractive manufacturing process. The 2.5-axis machining can use a 3-axis milling machine that can be moved in all three separate dimensions, but during most of the cutting operations, the milling tool is only moved in 2 axes with respect to the workpiece, which results in a more efficient manufacturing process. The subtractive process in the 2.5-axis machining occurs with continuous movement in the plane perpendicular to the milling tool but in discrete steps parallel to the milling tool. Compared with 3-axis subtractive manufacturing, the 2.5-axis subtractive manufacturing process can rapidly remove layers of material in sequence, and can create parts that often have a series of "pockets" at varying depths.

A three dimensional model 320 of an object for 2.5-axis machining by a computer-controlled manufacturing system is obtained 302, e.g., by the program(s) 116. A 2.5-axis generative design can use a generative design software to generate a CAD model of a 3D object that includes a plurality of discrete layers. For example, the CAD model 320 can have three layers including a bottom layer, a middle layer, and a top layer.

A plurality of two dimensional representations 322 of the three dimensional model are generated 304, e.g., by the program(s) 116. The plurality of 2D representations can be generated at discrete 2D layers of the 3D model in a pre-processing step. Each 2D representation can be an image representing a cross section of the 3D model of the object. For example, the 2D representation 322 can be an image representing a cross section of the 3D model 320 at the height of the middle layer. The 2D representation 322 can include a region 326 that represents the object (e.g., the part), and a region 328 outside the object (e.g., outside the part) where the stock material needs to be removed.

The two dimensional representation is provided to a machine learning algorithm, e.g., by the program(s) 116. The machine learning algorithm 306 can be trained to generate toolpaths for the 2.5-axis machining, i.e., the machine learning algorithm 306 only operates in two dimensions even though it creates toolpaths that are usable to manufacture an object in three dimensions. Toolpaths 324 that are usable to manufacture at least a portion of the object using the 2.5-axis machining can be generated 308 based on the plurality of 2D representations, e.g., by the program(s) 116. In other words, each 2D representation can be provided to the machine learning algorithm to generate a corresponding set of toolpaths for manufacturing each discrete 2D layer. In some implementations, final toolpaths can be generated by combining all sets of toolpaths corresponding to the plurality of 2D representations of the 3D model.

The toolpaths can be provided 310 to the computer-controlled manufacturing system to manufacture at least the portion of the object using the 2.5-axis machining. For example, a toolpath 324 can be provided for removing the stock material at the lower-right portion 330 of the object using the 2.5-axis machining.

In some implementations, the machine learning algorithm can include two or more machine learning algorithms. At least one starting position of the tool can be generated by processing a global view of the 3D model with a first of the two or more machine learning algorithms. For each of the at least one starting position, a set of toolpaths can be generated by processing a local view of the 3D model near each starting position (e.g., an array of values representing pixels around the edge of the cutter's surface or sets of values representing concentric circles going out from the cutter's surface) using a second of the two or more machine learning algorithms. The manufacturing process can operate in a teleport-then-remove method. At each iteration, the tool can quickly move to a desired starting position without performing any cutting operations. Then the tool can perform cutting in a local region that is near the at least one starting position. This method of using two or more machine learning algorithms to perform long term planning followed by local cutting can be applied to various types of computer-controlled manufacturing system, and is not only limited to 2.5-axis machining.

For example, the image representation 323 of the object shows four local regions 330, 332, 334, and 336 that are outside the object. Some of the region (e.g., the region 336) may not be accessible to a tool that works in another region (e.g., the region 330) if the tool only moves in a 2D plane that is perpendicular to the tool. The first machine learning algorithm, can generate four starting positions for manufacturing each of the four regions 330, 332, 334, and 336. A second machine learning algorithm can generate toolpaths usable to remove the stock material in each of the four regions 330, 332, 334, and 336.

In some implementations, generating the at least one starting position can include processing the global view of the 3D model with the first of the two or more machine learning algorithms using discretized representations of the 3D model of the manufacturable object and of a model of a stock material from which the at least the portion of the manufacturable object is to be manufactured. The discretized representation of the object and the stock material can reduce the amount of computation and can improve efficiency of the first machine learning algorithm. In some implementations, generating the set of toolpaths can include processing the local view with the second of the two or more machine learning algorithms using a continuous representation of a model of a tool in the computer-controlled manufacturing system to be used to manufacture the at least the portion of the manufacturable object. For example, the system can use a continuous representation of the tool(s) as the input to the second of the two or more machine learning algorithms to generate precise toolpaths that perform local cutting that is close to the CAD model.

In some implementations, generating the at least one starting position can include processing the global view with the first of the two or more machine learning algorithms using a discretized representation of the model of the tool. In some implementations, generating the set of toolpaths can include processing the local view with the second of the two or more machine learning algorithms using continuous representations of the 3D model of the manufacturable object and of the model of the stock material. For example, the system can use continuous representations of the 3D model of the object and of the model of the stock material as an input to the second of the two or more machine learning algorithms to generate the portions of the toolpaths that perform local cutting that is close to the CAD model. The continuous representation of the object and the stock material can improve the precision of the local cutting that is close to the CAD model.

In some implementations, the system can use discretized representations of the 3D model of the manufacturable object and of the model of the stock material in both the first and the second of the two or more machine learning algorithms, and the system can use high resolution discretized representations of the models during the processing of the local view with the second of the two or more machine learning algorithms. For example, the system can process the global view with the first of the two or more machine learning algorithms using a low resolution discretized representation, e.g., an image, of the 3D models of the object, and each pixel in the image can have a physical size of 5 mm×5 mm. The system can process the local view with the second of the two or more machine learning algorithms using a high resolution discretized representation, e.g., an image, of the 3D models of the object, and each pixel in the image can have a physical size of 0.5 mm×0.5 mm.

In some implementations, after most of the stock material has been removed, there may still be some small pieces of stock material left. These small pieces of material that need to be removed may not be close to each other. The above described teleport-then-remove method can effectively remove small pieces of stock material that are far away from each other. Instead of just using a local view near the tool and searching for the next piece of stock material, the machine learning algorithm can take advantage of a global view of all the remaining pieces, and can quickly send the tool to a starting location of the next piece of stock material.

Figure 4:
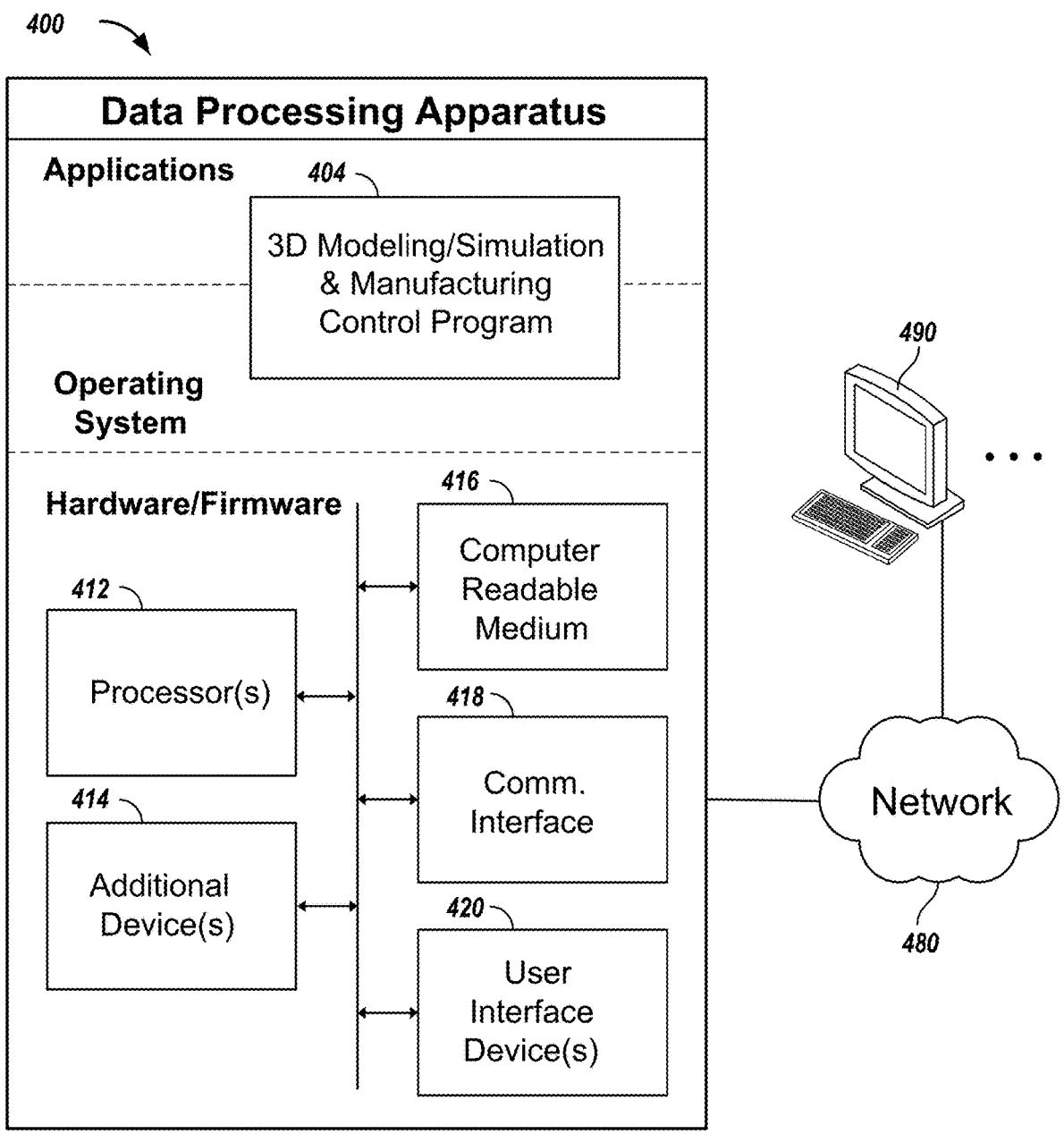
FIG. 4 is a schematic diagram of a data processing system usable to implement the described systems and techniques.

FIG. 4 is a schematic diagram of a data processing system including a data processing apparatus 400, which can be programmed as a client or as a server. The data processing apparatus 400 is connected with one or more computers 490 through a network 480. While only one computer is shown in FIG. 4 as the data processing apparatus 400, multiple computers can be used. The data processing apparatus 400 includes various software modules, which can be distributed between an applications layer and an operating system. These can include executable and/or interpretable software programs or libraries, including tools and services of a 3D modeling/simulation and manufacturing control program 404 that implements the systems and techniques described above. The number of software modules used can vary from one implementation to another. Moreover, the software modules can be distributed on one or more data processing apparatus connected by one or more computer networks or other suitable communication networks.

The data processing apparatus 400 also includes hardware or firmware devices including one or more processors 412, one or more additional devices 414, a computer readable medium 416, a communication interface 418, and one or more user interface devices 420. Each processor 412 is capable of processing instructions for execution within the data processing apparatus 400. In some implementations, the processor 412 is a single or multi-threaded processor. Each processor 412 is capable of processing instructions stored on the computer readable medium 416 or on a storage device such as one of the additional devices 414. The data processing apparatus 400 uses its communication interface 418 to communicate with one or more computers 490, for example, over a network 480. Examples of user interface devices 420 include a display, a camera, a speaker, a microphone, a tactile feedback device, a keyboard, a mouse, and VR and/or AR equipment. The data processing apparatus 400 can store instructions that implement operations associated with the program(s) described above, for example, on the computer readable medium 416 or one or more additional devices 414, for example, one or more of a hard disk device, an optical disk device, a tape device, and a solid state memory device.

Embodiments of the subject matter and the functional operations described in this specification can be implemented in digital electronic circuitry, or in computer software, firmware, or hardware, including the structures disclosed in this specification and their structural equivalents, or in combinations of one or more of them. Embodiments of the subject matter described in this specification can be implemented using one or more modules of computer program instructions encoded on a non-transitory computer-readable medium for execution by, or to control the operation of, data processing apparatus. The computer-readable medium can be a manufactured product, such as a hard drive in a computer system or an optical disc sold through retail channels, or an embedded system. The computer-readable medium can be acquired separately and later encoded with the one or more modules of computer program instructions, such as by delivery of the one or more modules of computer program instructions over a wired or wireless network. The computer-readable medium can be a machine-readable storage device, a machine-readable storage substrate, a memory device, or a combination of one or more of them.

The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, a runtime environment, or a combination of one or more of them. In addition, the apparatus can employ various different computing model infrastructures, such as web services, distributed computing and grid computing infrastructures.

A computer program (also known as a program, software, software application, script, or code) can be written in any form of programming language, including compiled or interpreted languages, declarative or procedural languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive), to name just a few. Devices suitable for storing computer program instructions and data include all forms of non-volatile memory, media and memory devices, including by way of example semiconductor memory devices, e.g., EPROM (Erasable Programmable Read-Only Memory), EEPROM (Electrically Erasable Programmable Read-Only Memory), and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

To provide for interaction with a user, embodiments of the subject matter described in this specification can be implemented on a computer having a display device, e.g., an LCD (liquid crystal display) display device, an OLED (organic light emitting diode) display device, or another monitor, for displaying information to the user, and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

The computing system can include clients and servers. A client and server are generally remote from each other and typically interact through a communication network. The relationship of client and server arises by virtue of computer programs running on the respective computers and having a client-server relationship to each other. Embodiments of the subject matter described in this specification can be implemented in a computing system that includes a back-end component, e.g., as a data server, or that includes a middleware component, e.g., an application server, or that includes a front-end component, e.g., a client computer having a graphical user interface or a Web browser through which a user can interact with an implementation of the subject matter described is this specification, or any combination of one or more such back-end, middleware, or front-end components. The components of the system can be interconnected by any form or medium of digital data communication, e.g., a communication network. Examples of communication networks include a local area network ("LAN") and a wide area network ("WAN"), an internetwork (e.g., the Internet), and peer-to-peer networks (e.g., ad hoc peer-to-peer networks).

While this specification contains many implementation details, these should not be construed as limitations on the scope of what is being or may be claimed, but rather as descriptions of features specific to particular embodiments of the disclosed subject matter. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desired results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the invention have been described. Other embodiments are within the scope of the following claims.

What is claimed is:

1. A method comprising:
obtaining, in a computer aided design or manufacturing program, a three dimensional (3D) model of a manufacturable object;
generating, by the computer aided design or manufacturing program, toolpaths that are usable by a computer-controlled manufacturing system to manufacture at least a portion of the manufacturable object by providing at least a portion of the three dimensional model to a machine learning algorithm that employs reinforcement learning during training, wherein the machine learning algorithm includes one or more scoring functions that include rewards that correlate with desired toolpath characteristics comprising toolpath smoothness, toolpath length, and avoiding collision with the three dimensional model, wherein the machine learning algorithm comprises two or more machine learning algorithms, and providing at least the portion of the three dimensional model to the machine learning algorithm comprises:
generating at least one starting position by processing a global view of at least the portion of the three dimensional model with a first of the two or more machine learning algorithms; and
generating a set of toolpaths near each of the at least one starting position by processing a local view of at least the portion of the three dimensional model with a second of the two or more machine learning algorithms; and
providing the toolpaths to the computer-controlled manufacturing system to manufacture at least the portion of the manufacturable object.

2. The method of claim 1, wherein the desired toolpath characteristics comprise tool engagement for a selected cutting tool and a contact track of a selected tool.

3. The method of claim 1, wherein the machine learning algorithm employs variable feeds and/or speeds.

4. A method comprising:
obtaining, in a computer aided design or manufacturing program, a three dimensional (3D) model of a manufacturable object;
generating, by the computer aided design or manufacturing program, toolpaths that are usable by a computer-controlled manufacturing system to manufacture at least a portion of the manufacturable object by providing at least a portion of the three dimensional model to a machine learning algorithm that employs reinforcement learning during training, wherein the machine learning algorithm includes one or more scoring functions that include rewards that correlate with desired toolpath characteristics comprising toolpath smoothness, toolpath length, and avoiding collision with the three dimensional model, wherein the machine learning algorithm comprises two or more machine learning algorithms, and providing at least the portion of the three dimensional model comprises:
processing at least the portion of the three dimensional model with a first of the two or more machine learning algorithms; and
processing the portion of the three dimensional model with a second of the two or more machine learning algorithms to produce the toolpaths; and
providing the toolpaths to the computer-controlled manufacturing system to manufacture at least the portion of the manufacturable object.

5. The method of claim 4, wherein the first of the two or more machine learning algorithms comprises a convolutional neural network used to generate data from the portion of the three dimensional model to be processed with the second of the two or more machine learning algorithms.

6. The method of claim 4, wherein the first of the two or more machine learning algorithms operates on a low resolution view of at least the portion of the three dimensional model, and the second of the two or more machine learning algorithms operates on a high resolution view of the portion of the three dimensional model.

7. The method of claim 1, wherein the machine learning algorithm comprises an advantage based actor-critic machine learning architecture.

8. The method of claim 1, wherein the toolpaths are for 2.5-axis machining by the computer-controlled manufacturing system.

9. The method of claim 8, wherein generating the toolpaths that are usable by the computer-controlled manufacturing system to manufacture at least the portion of the manufacturable object comprises:
generating a plurality of two dimensional (2D) representations of the three dimensional model at discrete 2D layers;
providing each 2D representation to the machine learning algorithm to generate a corresponding set of toolpaths for manufacturing each discrete 2D layers; and
generating the toolpaths that are usable by the computer-controlled manufacturing system by combining the corresponding sets of the toolpaths for the plurality of 2D representations of the three dimensional model at discrete 2D layers.

10. The method of claim 1, wherein generating the at least one starting position comprises processing the global view with the first of the two or more machine learning algorithms using discretized representations of the three dimensional model of the manufacturable object and of a model of a stock material from which the at least the portion of the manufacturable object is to be manufactured, and wherein generating the set of toolpaths comprises processing the local view with the second of the two or more machine learning algorithms using a continuous representation of a model of a tool in the computer-controlled manufacturing system to be used to manufacture the at least the portion of the manufacturable object.

11. The method of claim 10, wherein generating the at least one starting position comprises processing the global view with the first of the two or more machine learning algorithms using a discretized representation of the model of the tool, and generating the set of toolpaths comprises processing the local view with the second of the two or more machine learning algorithms using continuous representations of the three dimensional model of the manufacturable object and of the model of the stock material.

12. The method of claim 1, wherein the desired toolpath characteristics comprise a turn direction of a tool being set based on a rotation direction of the tool.

13. The method of claim 12, wherein the turn direction of the tool is set based on a location of the tool relative to the 3D model of the manufacturable object, wherein the one or more scoring functions include one or more rewards that encourage freely choosing a turning direction for the tool when the location of the tool is greater than a threshold distance from the 3D model of the manufacturable object, and the one or more rewards encourage the tool to turn only in one direction, which exposes a correct side of the tool based on the rotation direction, when the location of the tool is within the threshold distance from the 3D model of the manufacturable object.

14. The method of claim 1, wherein the machine learning algorithm includes the one or more scoring functions that include stage-based rewards that correlate with corresponding percentages of completion of the manufacturable object.

15. A system comprising:
a data processing apparatus including at least one hardware processor; and
a non-transitory computer-readable medium encoding instructions configured to cause the data processing apparatus to perform operations comprising
obtaining, in a computer aided design or manufacturing program, a three dimensional (3D) model of a manufacturable object;
generating, by the computer aided design or manufacturing program, toolpaths that are usable by a computer-controlled manufacturing system to manufacture at least a portion of the manufacturable object by providing at least a portion of the three dimensional model to a machine learning algorithm that employs reinforcement learning during training, wherein the machine learning algorithm includes one or more scoring functions that include rewards that correlate with desired toolpath characteristics comprising toolpath smoothness, toolpath length, and avoiding collision with the three dimensional model, wherein the machine learning algorithm comprises two or more machine learning algorithms, and providing at least the portion of the three dimensional model to the machine learning algorithm comprises:
generating at least one starting position by processing a global view of at least the portion of the three dimensional model with a first of the two or more machine learning algorithms; and
generating a set of toolpaths near each of the at least one starting position by processing a local view of at least the portion of the three dimensional model with a second of the two or more machine learning algorithms; and
providing the toolpaths to the computer-controlled manufacturing system to manufacture at least the portion of the manufacturable object.

16. The system of claim 15, wherein the desired toolpath characteristics comprise tool engagement for a selected cutting tool and a contact track of a selected tool.

17. A non-transitory computer-readable medium encoding instructions operable to cause a data processing apparatus to perform operations comprising
obtaining, in a computer aided design or manufacturing program, a three dimensional (3D) model of a manufacturable object;
generating, by the computer aided design or manufacturing program, toolpaths that are usable by a computer-controlled manufacturing system to manufacture at least a portion of the manufacturable object by providing at least a portion of the three dimensional model to a machine learning algorithm that employs reinforcement learning during training, wherein the machine learning algorithm includes one or more scoring functions that include rewards that correlate with desired toolpath characteristics comprising toolpath smoothness, toolpath length, and avoiding collision with the three dimensional model, wherein the machine learning algorithm comprises two or more machine learning algorithms, and providing at least the portion of the three dimensional model to the machine learning algorithm comprises:
generating at least one starting position by processing a global view of at least the portion of the three dimensional model with a first of the two or more machine learning algorithms; and
generating a set of toolpaths near each of the at least one starting position by processing a local view of at least the portion of the three dimensional model with a second of the two or more machine learning algorithms; and
providing the toolpaths to the computer-controlled manufacturing system to manufacture at least the portion of the manufacturable object.

18. The system of claim 15, wherein the machine learning algorithm employs variable feeds and/or speeds.

19. The system of claim 15, wherein the machine learning algorithm comprises an advantage based actor-critic machine learning architecture.

20. The system of claim 15, wherein the toolpaths are for 2.5-axis machining by the computer-controlled manufacturing system.

21. A system comprising:
a data processing apparatus including at least one hardware processor; and
a non-transitory computer-readable medium encoding instructions configured to cause the data processing apparatus to perform operations comprising:
obtaining, in a computer aided design or manufacturing program, a three dimensional (3D) model of a manufacturable object;
generating, by the computer aided design or manufacturing program, toolpaths that are usable by a computer-controlled manufacturing system to manufacture at least a portion of the manufacturable object by providing at least a portion of the three dimensional model to a machine learning algorithm that employs reinforcement learning during training, wherein the machine learning algorithm includes one or more scoring functions that include rewards that correlate with desired toolpath characteristics comprising toolpath smoothness, toolpath length, and avoiding collision with the three dimensional model, wherein the machine learning algorithm comprises two or more machine learning algorithms, and providing at least the portion of the three dimensional model comprises:

processing at least the portion of the three dimensional model with a first of the two or more machine learning algorithms; and processing the portion of the three dimensional model with a second of the two or more machine learning algorithms to produce the toolpaths; and providing the toolpaths to the computer-controlled manufacturing system to manufacture at least the portion of the manufacturable object.

22. The system of claim 21, wherein the first of the two or more machine learning algorithms comprises a convolutional neural network used to generate data from the portion of the three dimensional model to be processed with the second of the two or more machine learning algorithms.

23. The system of claim 21, wherein the first of the two or more machine learning algorithms operates on a low resolution view of at least the portion of the three dimensional model, and the second of the two or more machine learning algorithms operates on a high resolution view of the portion of the three dimensional model.

24. A non-transitory computer-readable medium encoding instructions operable to cause a data processing apparatus to perform operations comprising:

obtaining, in a computer aided design or manufacturing program, a three dimensional (3D) model of a manufacturable object;

generating, by the computer aided design or manufacturing program, toolpaths that are usable by a computer-controlled manufacturing system to manufacture at least a portion of the manufacturable object by providing at least a portion of the three dimensional model to a machine learning algorithm that employs reinforcement learning during training, wherein the machine learning algorithm includes one or more scoring functions that include rewards that correlate with desired toolpath characteristics comprising toolpath smoothness, toolpath length, and avoiding collision with the three dimensional model, wherein the machine learning algorithm comprises two or more machine learning algorithms, and providing at least the portion of the three dimensional model comprises:

processing at least the portion of the three dimensional model with a first of the two or more machine learning algorithms; and processing the portion of the three dimensional model with a second of the two or more machine learning algorithms to produce the toolpaths; and providing the toolpaths to the computer-controlled manufacturing system to manufacture at least the portion of the manufacturable object.

25. The non-transitory computer-readable medium of claim 24, wherein the first of the two or more machine learning algorithms comprises a convolutional neural network used to generate data from the portion of the three dimensional model to be processed with the second of the two or more machine learning algorithms.

26. The non-transitory computer-readable medium of claim 24, wherein the first of the two or more machine learning algorithms operates on a low resolution view of at least the portion of the three dimensional model, and the second of the two or more machine learning algorithms operates on a high resolution view of the portion of the three dimensional model.

* * * * *